United States Patent [19]

Kolmann

[11] 4,263,066
[45] Apr. 21, 1981

[54] PROCESS FOR CONCURRENT FORMATION OF BASE DIFFUSION AND P+ PROFILE FROM SINGLE SOURCE PREDEPOSITION

[75] Inventor: Knute E. Kolmann, San Carlos, Calif.

[73] Assignee: Varian Associates, Inc., Palo Alto, Calif.

[21] Appl. No.: 157,914

[22] Filed: Jun. 9, 1980

[51] Int. Cl.³ .......................................... H01L 21/225
[52] U.S. Cl. ................... 148/187; 148/188; 148/191
[58] Field of Search ................... 148/187, 188, 191

[56] References Cited

U.S. PATENT DOCUMENTS

| 3,574,010 | 4/1971 | Brown | 148/187 |
|---|---|---|---|
| 3,575,742 | 4/1971 | Gilbert | 148/188 X |
| 3,592,707 | 7/1971 | Jaccodine | 148/188 X |
| 3,615,938 | 10/1971 | Tsai et al. | 148/187 |
| 3,719,535 | 3/1973 | Zoroglu | 148/187 |
| 3,767,484 | 10/1973 | Takagi et al. | 148/191 X |
| 3,839,104 | 10/1974 | Yuan | 148/191 X |
| 3,880,676 | 4/1975 | Douglas et al. | 148/188 X |
| 3,915,767 | 10/1975 | Welliver | 148/188 X |
| 4,006,046 | 2/1977 | Pravin | 148/188 |
| 4,170,502 | 10/1979 | Watakabe | 148/191 |

Primary Examiner—G. Ozaki
Attorney, Agent, or Firm—Stanley Z. Cole; Edward H. Berkowitz

[57] ABSTRACT

A single source predeposition is required to concurrently form a base diffusion profile and p+ profile. For a boron doped silicon semiconductor devices this can be accomplished by depositing a silicon nitride layer directly over a boron source glass layer. After opening windows to the underlying silicon, diffusion in a wet oxide atmosphere results in formation of a resulting oxide in the windows with expenditure of boron by diffusion into this oxide as well as diffusion into the underlying substrate at a reduced concentration. In adjacent areas masked by the silicon nitride the boron source diffuses unidirectionally into the substrate yielding a maximum dopant concentration.

6 Claims, 7 Drawing Figures

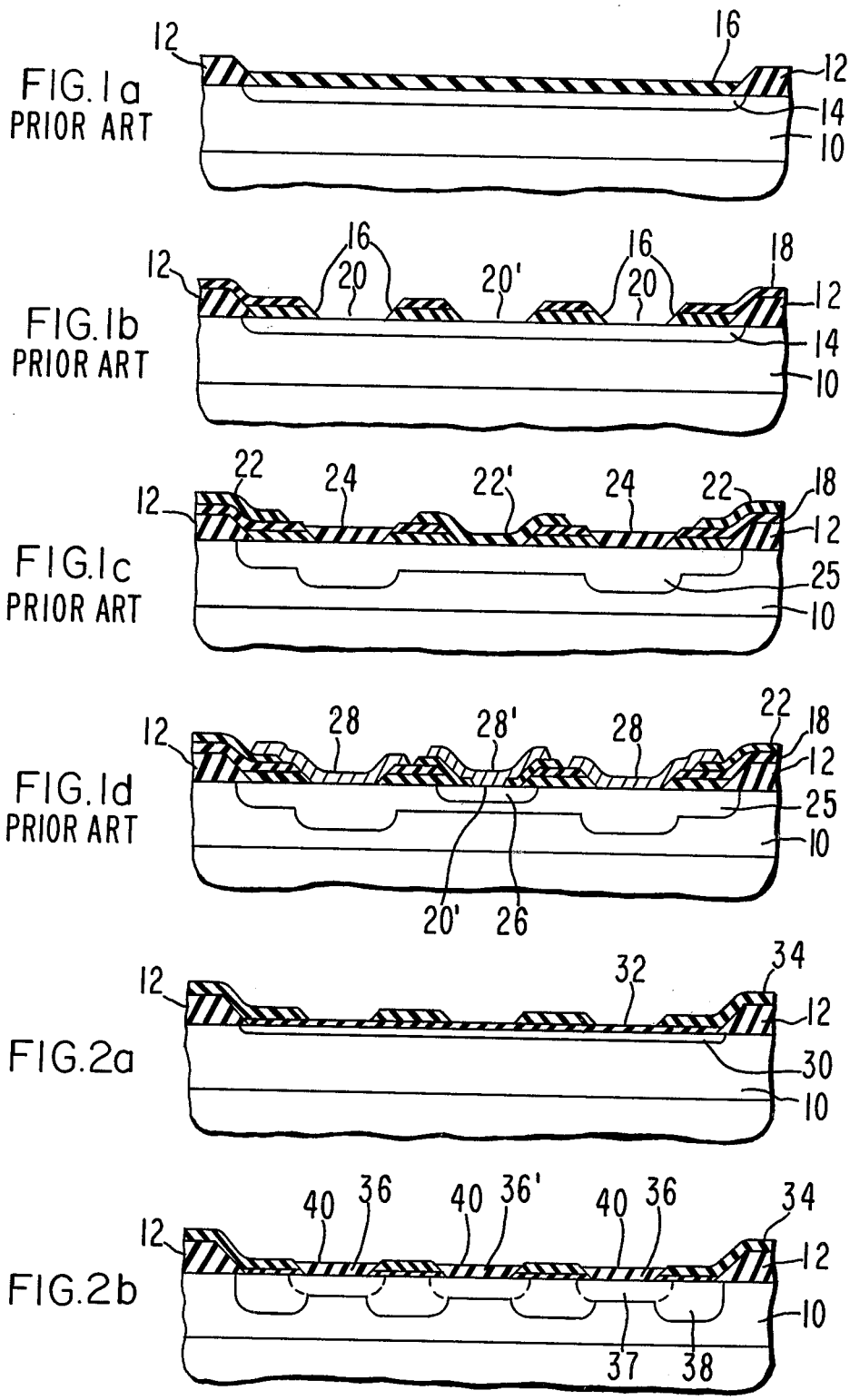

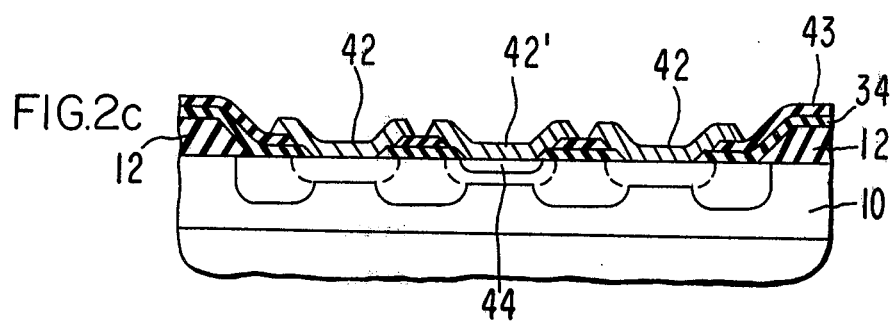

PROCESS FOR CONCURRENT FORMATION OF BASE DIFFUSION AND P+ PROFILE FROM SINGLE SOURCE PREDEPOSITION

DESCRIPTION

1. Field of the Invention

The present invention relates to planar semiconductor fabrication generally and in particular to concurrent formation of a base diffusion profile and boron enriched P+ profile with only one source predeposition.

2. Background of the Invention

In the fabrication of semiconductor devices such as bipolar transistors, structures are emplaced on the surface of an underlying substrate by any of several processes and properties of regions of the underlying substrate are altered by processes of controlled introduction and diffusion of impurities or dopants into the semiconductor material. In this way the electrical properties of the semiconductor material are selectively altered to produce active devices.

In the fabrication of conventional planar integrated circuits it is known to exploit the selectivity of silicon dioxide to diffusion of certain dopants for masking an underlying silicon substrate or epitaxial layer against impurity introduction. By photolithographic means, openings are made in the silicon dioxide layer during processing to define active and passive areas in the functional electronic block. Ordinarily, many such processes are required where the structure of the interior of the substrate is required to exhibit some complexity. For example, it is sometimes desired to introduce regions of relatively low electrical resistivity within an active region of a semiconductor device.

It is known in the prior art to alter the diffusion profile by opening a series of windows (usually adjacent to and in addition to contact window regions) and by additional diffusion steps to locally enhance the dopant concentration thereunder. This approach adds many additional process steps. A further improvement is accomplished by resort to inherently self-aligned emitter and base contact windows. This feature is realized with the added complexity additional steps of dielectric deposition, diffusion and photolithography processes. It is noteworthy that the packing density of devices situated on a common substrate is restricted by photolithographic limitations. Accordingly, it is important to minimize the number of process steps required for achieving the desired structures in the interior of the substrate.

SUMMARY OF THE INVENTION

It is an object of the present invention to form an active region diffusion profile and a p+ profile in the same process step.

In the present invention a base pattern is defined and a single base predeposition is performed. Deferring a drive-in diffusion of the predeposited dopant into the base material, a suitable dielectric layer, such as silicon nitride is deposited. An emitter and p+ pattern is then defined by the usual photographic methods. The diffusion is then initiated via wet oxidation process at elevated temperatures in the known manner. As a result, in the windows opened in the silicon nitride layer, silicon dioxide is formed and the boron source diffuses upward into this region, where it is subsequently removed as well as downward into the underlying silicon substrate where it forms the base region of an active device. In the regions masked by the silicon nitride (impermeable to the boron dopant) the entire boron source diffuses directly into the underlying silicon as expected. Thus, regions of maximum boron concentration (under the silicon nitride masked regions) and regions of reduced boron concentrations (under the window areas) are produced with but a single diffusion and single predeposition.

BRIEF DESCRIPTION OF THE DRAWINGS

FIGS. 1A, 1B, 1C and 1D illustrate selected steps in a conventional process fabrication sequence.

FIG. 2A is a cross section of a device of the present invention after application of the E P+ mask.

FIG. 2B illustrates a cross section of a semiconductor device of the present invention after the single diffusion step.

FIG. 2C illustrates a device of the present invention electrically similar to FIG. 1D.

DETAILED DESCRIPTION

The invention is best explained by reference first to a typical prior art sequence process showing steps for fabricating a portion of a multi-emitter Si bipolar structure. FIG. 1A shows the cross section of such a structure in an early stage of development. An epitaxial Si substrate layer 10 has first been subjected to thermal oxidation to form a $SiO_2$ layer 12. A base pattern is then defined and uncovered by the usual photoresist techniques and a predeposition of base impurity is executed. In a specific instance, the base dopant or impurity is boron, supplied in the form of boron nitride (BN). In a typical process, this might be obtained from boron nitride in an argon atmosphere at temperatures of the order of 900° C. The base impurity is then driven in by diffusion executed below an oxidizing environment at a temperature of the order of 1050° C. As a result, a base region 14 is obtained which is protected by an oxide layer 16.

Next a $Si_3N_4$ nitride layer 18 is deposited over the structure and an emitter/p+ pattern is defined and processed by photoresist techniques resulting in windows 20 and 20' open to the base region surface resulting in the structure of FIG. 1B.

Another $SiO_2$ layers 22 and 22' are deposited and the p+ pattern is again defined and windows 20 reopened to permit a predeposition of the p+ dopant and a subsequent diffusion at high temperature under an oxidizing atmosphere of the p+ dopant into the base region 14 to yield p+ region 25. Concurrently, the windows 20 are covered by formation of a resulting oxide layer 24. The structure at this point is illustrated in FIG. 1C.

Emitter window 20' is then reopened and an emitter diffusion step is executed therein to realize the emitter volume region 26. Following this and subsequent steps, the details of which are not germane to the present invention, finally yield the structure of FIG. 1D wherein metallized conductor substructures 28 and 28' have been formed.

In an alternate prior method structure a similar method may be realized although lacking self alignment. This alternate method differs from the above-described prior art method in that the emitter and base windows are formed at separate steps. Fewer steps are required because the emitter regions, not defined at the time the base regions are defined, need not be covered and reopened. However, the subsequent emitter region will not be self-aligned with respect to the base region.

Device performance is adversely affected by the consequent asymmetries.

In the present invention, simplifications are introduced following the base predeposition step. At this point, the base diffusion step is deferred. As shown on FIG. 2A following deposit of oxide layer 12 upon the epitaxial layer 10 and definition of the base pattern as in the prior art, there follows the predeposition of a dopant, as for example, boron. The predeposition yields a shallow concentration 30 of the B dopant into the surface of epitaxial substrate 10 with a glassy B source layer 32 overlaying this layer. A dense $Si_3N_4$ layer 34 is deposited.

The emitter/p+ mask is defined in the $Si_3N_4$ layer 34 and boron glass 32 defining windows 36 and 36' and the deferred diffusion step is now executed in an oxidizing atmosphere yielding the base volume region 37 and oxide window shades 40. During this step, the redistribution of the B dopant is profoundly affected by the overlaying $Si_3N_4$ layer 34 and the oxide window shades 40. Directly under the $Si_3N_4$ layer 34 the concentration of dopant is maximal because this layer is impermeable to the diffusion of the boron dopant therein; thus maximum concentration regions such as regions 38 are formed. However, under window "shades" 40 of the dopant diffuses into the overlying $SiO_2$ as well as into the underlying substrate thereby reducing the dopant concentration under these windows producing regions of reduced B concentration 37. The emitter formation and metallizing steps and other additional processing is not significantly different from the prior art. FIG. 2C shows the resulting structure wherein base metallization 42, emitter metallization 42', metallization oxide layer 43 and emitter region 44 have been added.

It will be observed that the above contrasts with the prior art in that the independent steps of redefining and reopening a p+ pattern, performing a p+ predeposition and a p+ diffusion, are steps which are either absent or obtained in the present invention concurrently with the formation of the base definition and diffusion. In further contrast with the prior art, the method of the present invention yields relatively low resistivity p+ regions in a perfectly aligned manner. One also observes a structural distinction in that there are regions of enhanced diffusion surrounding each windowed region whereas the prior described technique results in regions of enhanced diffusion under each contact window. This structural distinction can be further elaborated as a region of reduced conductivity disposed between the emitter and base contact regions. This results in enhanced device performance in frequency response and current handling capability.

The figures indicate that the diffusion depth is a function of the dopant concentration. While the thermal dependence of the diffusion depth is easily understood, the concentration dependence is a more complex phenomena, the details of which are not essential to an understanding of the invention.

The deposited material forming the so-called window shades 40 serves as a means for selectively controlling the underlying dopant concentration. The relative diffusion rate of the dopant in the substrate 10 and in the window shade 40 material as well as the thickness of the latter, effect the reduced concentration of the dopant in the base region. Where the diffusion coefficient for the window shade material is of significant magnitude in relation to that for the substrate, there will be a correspondingly significant quantity of the dopant absorbed in the window shades 40 hence, a corresponding reduction in the dopant material in the underlying base region 37.

As above described, the window shades 40 are formed concurrently with the diffusion step. The invention is not in general so limited. The window shades 40 can be formed by oxidation or deposition of a suitable material in an independent step. One will appreciate that concurrent formation of the window shades 40 is effectively an independent step if the rate at which the material 40 is deposited or formed substantially exceeds the diffusion rate into such material.

The present invention has been described with respect to a conventional Si bipolar technology with reference to boron dopants. That specificity is not intended to limit the scope of the present invention but merely to facilitate the discussion. Following selection of the epitaxial semiconductor material and the predeposition of the latter, the invention contemplates covering the predeposited dopant layer with a layer of material impermeable to dopant diffusion, opening windows in such layer where depleted dopant concentration is desired and filling such windows with a material into which the dopant will diffuse readily to a desired concentration. Consequently, it is intended that the scope of the present invention is defined by the claims appended below.

I claim:

1. A process for concurrently forming a first active region diffusion profile and a p+ profile in a semiconductor material comprising the steps of:
    defining lateral boundaries for said first active region on the surface of said semiconductor material;
    predepositing a selected dopant over a surface region of said semiconductor;
    depositing a first material over the predeposited dopant, said first material impermeable to diffusion therein by said dopant;
    redefining lateral boundaries for said first active region on the surface of said first material;
    removing said first material from surface regions interior of said first active region forming windows to the surface of said first active region; and
    diffusing said predeposited dopant into the semiconductor material at elevated temperatures in an oxidizing atmosphere whereby an oxidized surface layer is concurrently and rapidly formed in said windows, said oxidizing layer absorbing by diffusion a portion of said dopant underlying said windows.

2. The process of claim 1 further comprising removal of said oxidizing layer.

3. The process of claim 1 wherein said semiconductor material is epitaxial Si, said dopant is boron and said first material is $Si_3N_4$.

4. A process for concurrently forming a first active region diffusion profile and a p+ profile in a semiconductor material comprising the steps of:
    defining lateral boundaries for said first active region on the surface of said semiconductor material;
    predepositing a layer of selected dopant over a surface region of said semiconductor;
    depositing a first material over the predeposited dopant, said first material impermeable to diffusion therein by said dopant;
    redefining lateral boundaries for said first active region on the surface of said first material;

removing said first material from surface regions interior of said first active region forming windows to the surface of said predeposited layer;

forming a dopant absorbing layer contacting said predeposited layer in said windows; and diffusing said predeposited dopant concurrently into the dopant absorbing layer and the semiconductor material at elevated temperatures; whereby the quantity of dopant diffused into said semiconductor is reduced in said windows.

5. The process of claim 4 comprising removal of said dopant absorbing material.

6. The process of claim 4 wherein said semiconductor material is epitaxial Si, said dopant is boron and said first material is $Si_3N_4$.

* * * * *